(12) United States Patent
Inoue

(10) Patent No.: US 7,872,359 B2
(45) Date of Patent: Jan. 18, 2011

(54) ELECTRONIC COMPONENT CONTAINED SUBSTRATE

(75) Inventor: Akinobu Inoue, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 164 days.

(21) Appl. No.: 11/962,656

(22) Filed: Dec. 21, 2007

(65) Prior Publication Data

US 2008/0174977 A1    Jul. 24, 2008

(30) Foreign Application Priority Data

Dec. 26, 2006   (JP) .................... P.2006-348750

(51) Int. Cl.
- *H01L 23/48* (2006.01)
- *H01L 23/52* (2006.01)
- *H01L 29/40* (2006.01)

(52) U.S. Cl. .................. 257/784; 361/786; 361/761

(58) Field of Classification Search ............... 361/786, 361/761
See application file for complete search history.

(56) References Cited

U.S. PATENT DOCUMENTS

| 6,335,565 | B1 * | 1/2002 | Miyamoto et al. | 257/686 |
| 6,982,491 | B1 * | 1/2006 | Fan et al. | 257/778 |
| 2002/0127771 | A1 * | 9/2002 | Akram et al. | 438/107 |
| 2003/0098502 | A1 * | 5/2003 | Sota | 257/688 |

FOREIGN PATENT DOCUMENTS

JP    2003-347722    12/2003

* cited by examiner

*Primary Examiner*—Tuan T Dinh
*Assistant Examiner*—Andargie M Aychillhum
(74) *Attorney, Agent, or Firm*—Drinker Biddle & Reath LLP

(57) ABSTRACT

An electronic component contained substrate in which an electronic component is mounted between a pair of wiring substrates, wherein the wiring substrates are connected electrically via solder balls, an opening portion opened larger than a planar shape of the electronic component is formed in the other wiring substrate, which faces to one wiring substrate on which the electronic component is mounted, in a position that opposes the electronic component, and a space between a pair of wiring substrates is sealed with a sealing resin.

7 Claims, 10 Drawing Sheets

ELECTRONIC COMPONENT CONTAINED SUBSTRATE

This application claims priority from Japanese Patent Application No. 2006-348750, filed Dec. 26, 2006, in the Japanese Patent Office. The Japanese Patent Application No. 2006-348750 is incorporated by reference in its entirety.

TECHNICAL FIELD

The present disclosure relates to an electronic component contained substrate and, more particularly, an electronic component contained substrate on which an electronic component is mounted between a pair of wiring substrates.

RELATED ART

An electronic component contained substrate 100 constructed by mounting an electronic component 30 between a wiring substrate 10 on a lower layer side and a wiring substrate 20 on an upper layer side, connecting electrically the wiring substrate 10 and the wiring substrate 20 via solder balls 40, and filling a sealing resin 50 into a space between the wiring substrate 10 and the wiring substrate 20 has been proposed (see Patent Literature 1, for example). FIG. 11 is a cross sectional view-showing a structure of the-electronic component contained substrate in Patent Literature 1 (Japanese Patent Unexamined Publication No. 2003-347722).

As shown in FIG. 11, the electronic component contained substrate 100 in Patent Literature 1 has such a structure that the electronic component 30 is put/arranged between the wiring substrate 10 and the wiring substrate 20, the wiring substrates 10, 20 are connected electrically mutually via the solder balls 40, and a resultant structure is sealed with the sealing resin 50.

As shown in FIG. 11, in the structure of the electronic component contained substrate 100 in the related art, a total thickness of the electronic component contained substrate 100 is given as a total sum of thicknesses of the wiring substrate 10 and the wiring substrate 20 and a thickness of the sealing resin 50. Also, a clearance between the wiring substrate 10 and the wiring substrate 20 is decided by a thickness of the sealing resin 50 that seals a resultant structure to embed the electronic component 30 therein. Therefore, a diameter dimension of the solder ball 40 used to connect electrically the wiring substrate 10 and the wiring substrate 20 is inevitably enlarged to connect the wiring substrate 10 and the wiring substrate 20. As a result, there exits such a problem that, because an alignment interval of the solder balls 40 is expanded, a terminal area to which the solder balls 40 are secured is increased and thus a planar dimension (a plane area) of the electronic component contained substrate 100 is increased.

Also, as shown in FIG. 11, sometimes the structure of the electronic component contained substrate 100 is used by stacking a plurality of electronic component contained substrates 100, 100, 100, . . . in the thickness direction (for example, the semiconductor device having a POP (Package On Package) structure using the semiconductor element as the electronic component 30). In this mode, in reducing a total thickness of the electronic component contained substrate 100, the designer of the device cannot but employ a method of either reducing a thickness of the wiring substrate or reducing a thickness of the electronic component. As a result, there is a limit in thinning a thickness of the semiconductor device into which the semiconductor components are incorporated, and there exits such a problem that a thickness of the electronic component contained substrate 100 cannot be effectively reduced.

SUMMARY

Exemplary embodiments of the present invention provide an electronic component contained substrate that can reduce a planar dimension (a plane area) and a height dimension considerably and can be formed compactly.

The present invention provides an electronic component contained substrate comprising:

a pair of wiring substrates;

an electronic component which is mounted between the pair of wiring substrates;

a solder ball which electrically connects the pair of wiring substrates; and a sealing resin which seals a space between the pair of wiring substrates, wherein the other wiring substrate, which faces to one wiring substrate on which the electronic component is mounted, has an opening portion, which is larger than a planar shape of the electronic component, in a position that opposes the electronic component.

Also, the electronic component may be aligned and mounted such that the element component is contained in the opening portion of the other wiring substrate.

Also, the electronic component may be mounted such that an upper surface, which opposes a lower surface facing the one wiring substrate, is positioned within a thickness of the wiring substrate. Accordingly, since a distance between the wiring substrate on the lower layer side and the wiring substrate on the upper layer side can be further shortened, a diameter of the solder balls to connect electrically the wiring substrate on the lower layer side and the wiring substrate on the upper layer side can be made small. Also, because a diameter of the solder balls can be reduced, a thickness and a planar dimension (a plane area) of the electronic component contained substrate can be reduced. Also, because the electronic component is never protruded from the surface of the wiring substrate, a total thickness of the electronic component contained substrate can be reduced further.

Also, the electronic component may be sealed with the sealing resin to expose the upper surface. Therefore, the heat radiation performance of the electronic component from the exposed upper surface can be improved.

Also, the sealing resin may be filled in the opening portion. Also, it is preferable that the electronic component, which is contained in the opening portion, including the upper surface should be sealed with the sealing resin.

Accordingly, the electronic component can be protected without fail, and the electronic component contained substrate with high reliability can be provided.

Also, a core contained solder ball in which a solder is coated on an outer surface of a core material made of metal may be used as the solder ball. Also, the core material is formed of copper.

When such core contained solder ball is employed, the core material acts as the stopper between the wiring substrate on the lower layer side and the wiring substrate on the upper layer side. Therefore, a clearance between the wiring substrate on the lower layer side and the wiring substrate on the upper layer side can be kept constant, and a dimensional precision of the electronic component contained substrate can be enhanced. Also, the core contained solder ball acts effectively on an improvement of a mechanical strength of the electronic component contained substrate.

Also, the electronic component contained substrate may further comprises:

another electronic component or a circuit component which is mounted on an outer surface of the other wiring substrate with the opening portion to cover at least a part of opening area of the opening portion.

Accordingly, a packaging density of the electronic component contained substrate (semiconductor device) can be improved.

According to the electronic component contained substrate of the present invention, a height (thickness) dimension of the electronic component being mounted on the wiring substrate on the lower layer side can be held within the thickness of the wiring substrate on the upper layer side. Therefore, a clearance between the wiring substrate on the lower layer side and the wiring substrate on the upper layer side can be reduced. Accordingly, a diameter dimension of the solder ball used to connect electrically the wiring substrate on the lower layer side and the wiring substrate on the upper layer side can be reduced. In other words, an alignment pitch of the solder balls can be narrowed, and the required number of solder balls for the electric connection between the wiring substrate on the lower layer side and the wiring substrate on the upper layer side can be provided in a small space. Therefore, a planar dimension (a plane area) and a height dimension of the electronic component contained substrate can be reduced considerably.

Other features and advantages may be apparent from the following detailed description, the accompanying drawings and the claims.

DETAILED DESCRIPTION

First Embodiment

Figure 1:
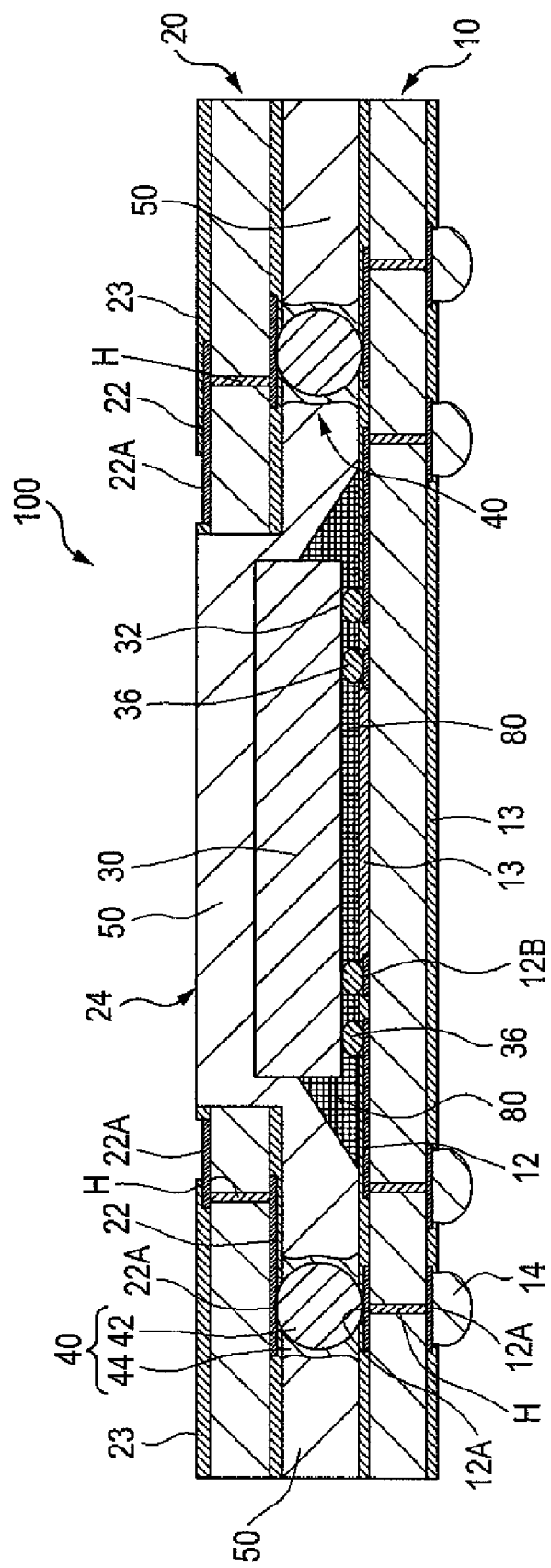
FIG. 1 is a cross sectional view of an electronic component contained substrate in a first embodiment of the present invention.
Figure 2:
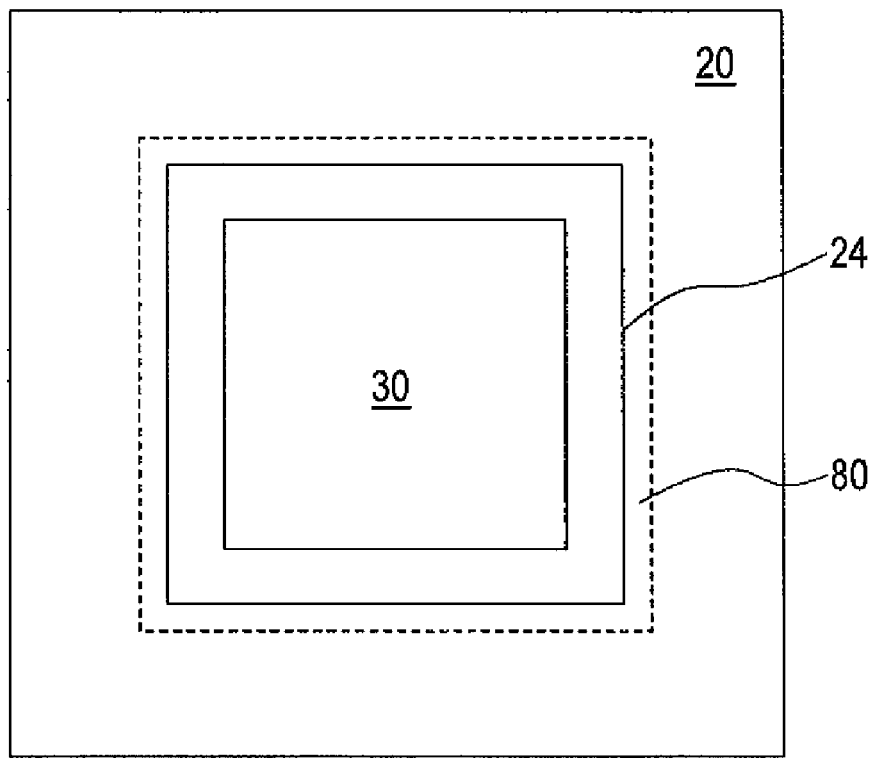
FIG. 2 is a plan view of an opening portion and its neighboring area in the electronic component contained substrate in FIG. 1.
Figure 3:
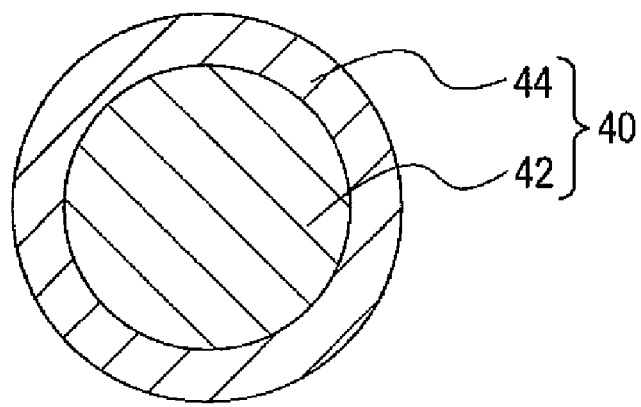
FIG. 3 is a sectional view showing a structure of a solder ball used in the first embodiment.

Embodiments of an electronic component contained substrate according to the present invention will be explained with reference to the drawings hereinafter. FIG. 1 is a cross sectional view of an electronic component contained substrate in a first embodiment of the present invention. FIG. 2 is a plan view of an opening portion and its neighboring area in the electronic component contained substrate in FIG. 1. FIG. 3 is a sectional view showing a structure of a solder ball used in the first embodiment.

In the electronic component contained substrate 100 in the present invention, a semiconductor element 30 as the electronic component is mounted between a pair of wiring substrates (a wiring substrate 10-and-a wiring substrate 20), and the wiring substrate 10 as one wiring substrate and the wiring substrate 20 as the other wiring substrate are connected electrically via the solder balls 40. Also, the sealing resin 50 is filled in a space between the wiring substrate 10 and the wiring substrate 20.

A wiring pattern 12 is formed of a conductor such as copper, or the like on upper and lower surfaces of the wiring substrate 10 by the publicly known method respectively. A surface of the wiring substrate 10 is covered with a resist 13, and portions of the wiring pattern 12 to which the connection terminals are connected are exposed as connection pads 12A, 12B. Also, external connection terminals 14 are joined to the connection pads 12A on the lower surface side of the wiring substrate 10. The external connection terminals 14 joined to the lower surface side of the wiring substrate 10 and the wiring pattern 12 formed on the upper surface side are connected electrically via through holes H.

The semiconductor element 30 as the electronic component is mounted on the upper surface of the wiring substrate 10. The semiconductor element 30 is connected to the connection pads 12B of the wiring substrate 10 via bumps 36 such as solder bumps, gold bumps, or the like, which are joined to electrode surfaces 32, by flip-chip bonding. An underfill resin 80 is injected into a space between a lower surface of the semiconductor element 30 and the upper surface of the wiring substrate 10 such that the electrode surfaces 32, the bumps 36, and the connection pads 12B are sealed.

Like the wiring substrate 10, a wiring pattern 22 is formed of the conductor such as copper, or the like on upper and lower surfaces of the wiring substrate 20 by the publicly known method respectively. A surface of the wiring substrate 20 is covered with a resist 23, and portions of the wiring pattern 22 to which the connection terminals are joined are exposed as connection pads 22A. The wiring patterns 22 formed on both surfaces of the wiring substrate 20 are connected electrically mutually via the through holes H.

FIG. 2 is a plan view showing the opening portion and its neighboring area in the wiring substrate 20. As shown in FIG. 2, an opening portion 24 is provided to the wiring substrate 20 to pass through the wiring substrate 20 in the thickness direction. The opening portion 24 is provided such that this opening portion is opened in-the same position as a planar position of the semiconductor element 30 mounted on the wiring substrate 10 when the wiring substrate 20 is stacked on the wiring substrate 10. The opening portion 24 is formed more largely than a planar dimension of the semiconductor element 30 in such a way that the semiconductor element 30 can be contained in the opening portion 24.

The wiring substrate 10 and the wiring substrate 20 are connected electrically via the solder balls 40. The connection pads 12A, which are formed on the upper surface of the wiring substrate 10 and to which the solder balls 40 are joined, and the connection pads 22A, which are formed on the lower surface side of the wiring substrate 20 and to which the solder balls 40 are joined, are provided in the same planar positions. The solder balls 40 are joined to respective connection pads 12A, 22A. When the wiring substrate 20 is fitted to the wiring substrate 10 in this manner, a part of the back surface side of the semiconductor element 30 is positioned to enter into the opening portion 24 of the wiring substrate 20. In other words, the wiring substrate 20 can be stacked on the wiring substrate 10 in a situation that a part of thickness of the semiconductor element 30 is placed within a thickness of the wiring substrate 20. The "back surface" of the semiconductor element is a surface opposite to a surface where an electrode is formed.

In the present embodiment, as shown in FIG. 3, the copper core contained solder ball 40 formed by coating an outer surface of a copper core 42 with a solder 44 is used as the solder ball 40 that joins the wiring substrate 10 and the wiring substrate 20 mutually. This copper core 42 is formed copper material as a metal and shaped into a solid sphere.

Because the solder ball 40 containing the copper core 42 therein is employed, the wiring substrate 10 and the wiring substrate 20 are connected electrically in such a condition that at least a clearance between the connection pad 12A of the wiring substrate 10 and the connection pads 22A of the wiring substrate 20 can be kept at a clearance that is equivalent to a diameter dimension of the copper core 42.

Also, the sealing resin 50 is filled into a space between the wiring substrate 10 and the wiring substrate 20. Thus, the space between the wiring substrate 10 and the wiring substrate 20 and the back surface of the semiconductor element 30 are sealed with the sealing resin 50.

Next, a method of manufacturing the electronic component contained substrate 100 in the first embodiment will be explained with reference to FIG. 4 to FIG. 7 hereunder.

Figure 4:
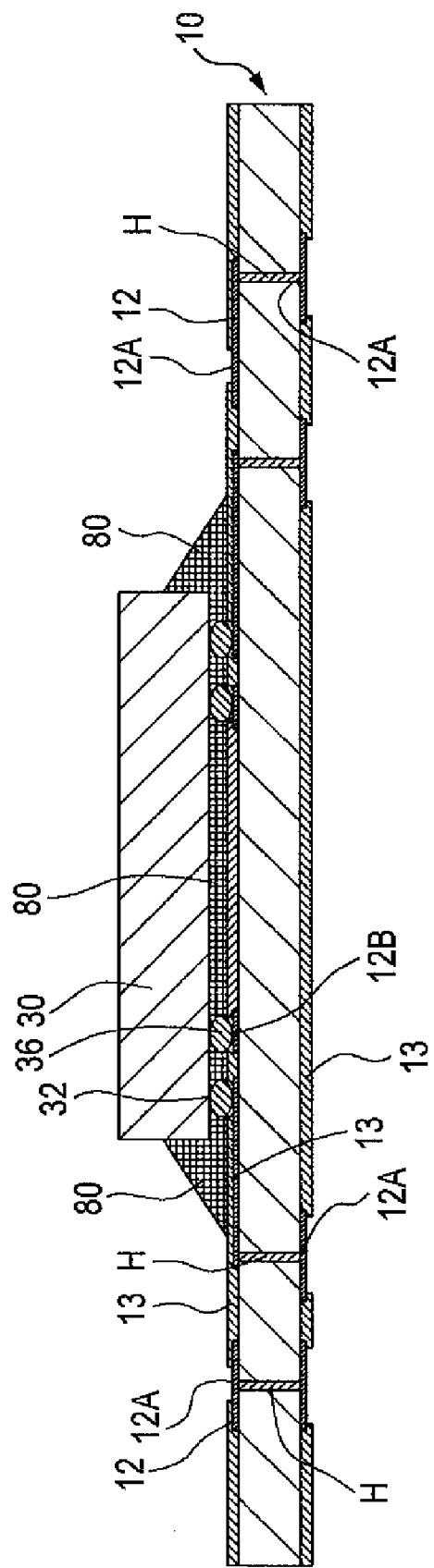
FIG. 4 is an explanatory view showing a state in the middle of steps of manufacturing the electronic component contained substrate.

First, as shown in FIG. 4, the semiconductor element 30 as the electronic component is mounted on the wiring substrate 10 as one wiring substrate. The semiconductor element 30 is mounted on the wiring substrate 10 by flip-chip bonding while aligning the bumps 36 with the connection pads 12B formed on the upper surface of the wiring substrate 10. After the semiconductor element 30 is mounted on the wiring substrate 10 by flip-chip bonding, the underfill resin 80 is injected into a space between the semiconductor element 30 and the upper surface of the wiring substrate 10.

Figure 5:
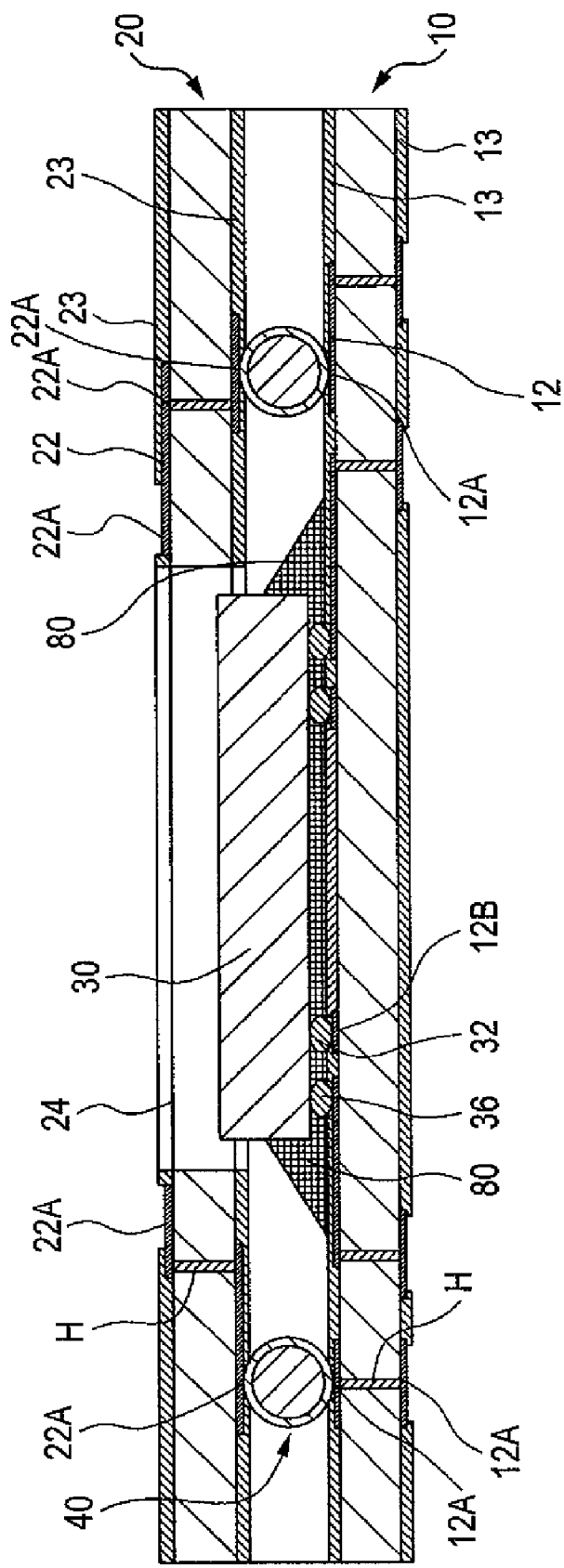
FIG. 5 is an explanatory view showing a state in the middle of steps of manufacturing the electronic component contained substrate.

After the underfill resin 80 is injected, as shown in FIG. 5, the wiring substrate 20 to the connection pad 22A of which the solder balls 40 are joined is aligned with the wiring substrate 10 and stacked thereon. The opening portion 24 formed in the wiring substrate 20 is formed in registration with a planar position of the semiconductor element 30 that is mounted on the wiring substrate 10. Therefore, when the wiring substrate 20 is stacked on the wiring substrate 10, a part of the back surface side of the semiconductor element 30 comes in the opening portion 24, as shown in FIG. 5, and thus a height position of the back surface of the semiconductor element 30 is set within the thickness of the wiring substrate 20. After the-wiring substrate 20 is aligned in this way and then stacked on the wiring substrate 10, the wiring substrate 20 is joined to the wiring substrate 10 via the solder balls 40 by the reflowing step (FIG. 6).

Figure 6:
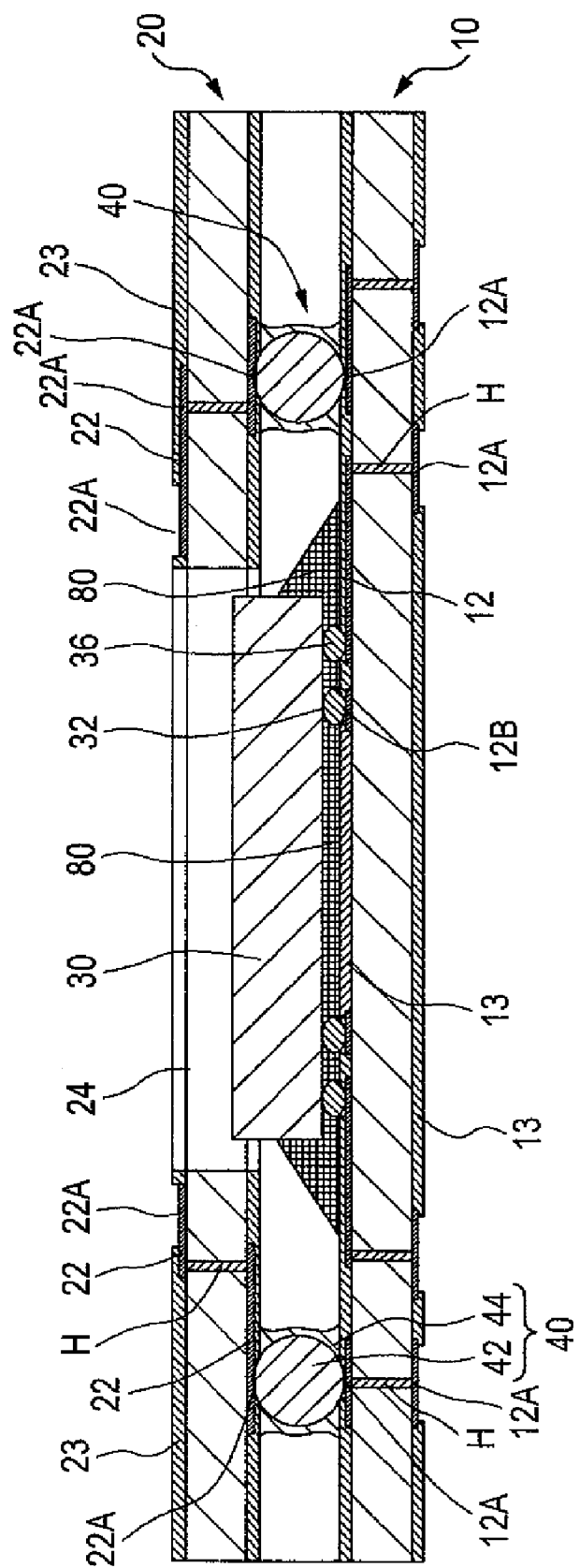
FIG. 6 is an explanatory view showing a state in the middle of steps of manufacturing the electronic component contained substrate.

As shown in FIG. 6, when the solder balls 40 are subjected to the reflowing step, the solder 44 for covering the outer periphery of the copper core 42 is fused. Thus, the connection pads 12A of the wiring substrate 10 and the connection pads 22A of the wiring substrate 20 can be connected electrically mutually by the solder 44 and the copper core 42, and also a clearance between the wiring substrates 10, 20 can be kept by the copper cores 42 that act as the stopper.

Figure 7:
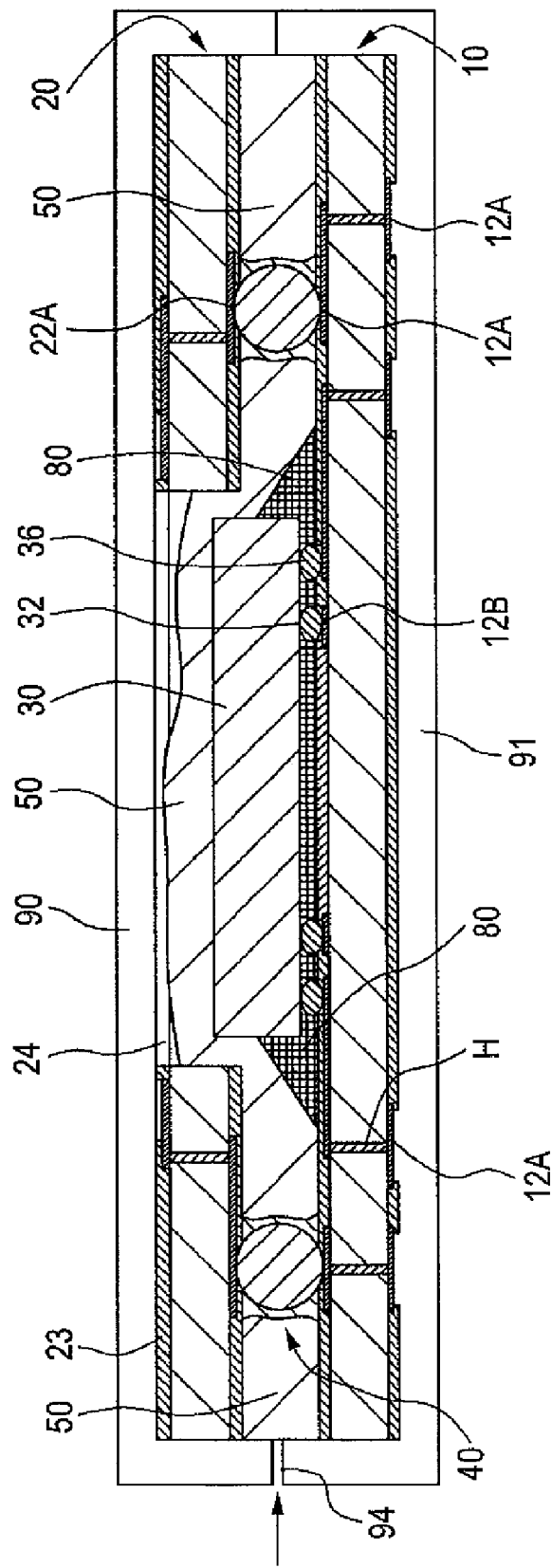
FIG. 7 is an explanatory view showing a state in the middle of steps of manufacturing the electronic component contained substrate.

After the reflow of the solder balls 40 is completed, the structure is rinsed by the flux, and then the sealing resin 50 is filled into a space between the wiring substrate 10 and the wiring substrate 20 (FIG. 7).

As the method of filling the sealing resin 50 into a space between the wiring substrates 10, 20, for example, as shown in FIG. 7, there is the method of clamping the wiring substrate 10 and the wiring substrate 20 by resin sealing molds 90, 91 and then press injecting the sealing resin 50 into a space between the wiring substrate 10 and the wiring substrate 20 from a gate 94. The sealing resin 50 being press injected is cured by a heating.

Figure 8:
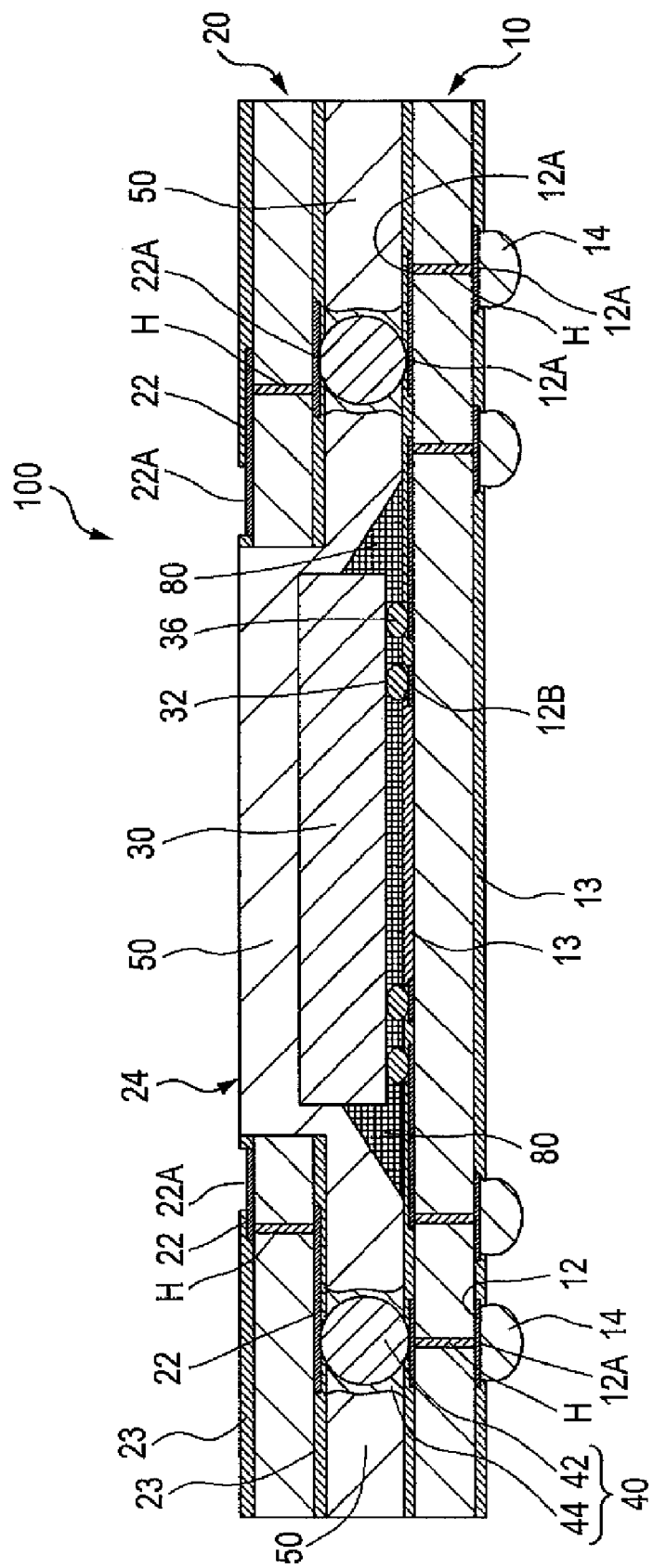
FIG. 8 is a cross sectional view showing the electronic component contained substrate in which a space between a wiring substrate on a lower layer side and a wiring substrate on an upper layer side, a whole surface of the back surface side of a semiconductor element, and the opening portion are sealed with a sealing resin.

Then, the resin sealing molds 90, 91 are removed after the sealing resin 50 is thermally cured. Then, the external connection terminals 14 are joined to the connection pads 12A on the lower surface of the wiring substrate 10, whereby the electronic component contained substrate 100 is completed. FIG. 8 shows the electronic component contained substrate, in which a space between the wiring substrate 10 and the wiring substrate 20, a whole surface of the back surface side of the semiconductor element, and the opening portion are sealed with a sealing resin.

In the explanation of the present manufacturing method, one electronic component contained substrate 100 is illustrated and explained. However, in the actual manufacturing method, a plurality of electronic component contained substrates 100, 100, . . . , 100 are resin sealed simultaneously by using a large-size wiring substrate 10 and a large-size wiring substrate 20, and then they are cut along individual outer shapes of the substrates and are divided into individual pieces.

In the electronic component contained substrate 100 according to the present embodiment, the semiconductor element 30 is mounted between the wiring substrate 10 and the wiring substrate 20 in a state that its back surface side gets in the opening portion 24 of the wiring substrate 20, so that the back surface position of the semiconductor element 30 is positioned within the thickness of the wiring substrate 20. In other words, a part of height (thickness) of the semiconductor element 30 is held within the thickness of the wiring substrate 20. A clearance between the wiring substrate 10 and the wiring substrate 20 can be reduced by employing this structure. As a result, a diameter dimension of the solder ball 40 can be reduced considerably rather than the electronic component contained substrate 100, an alignment pitch of the solder balls 40 can be narrowed, and a joined area of the solder ball 40 can be reduced. Also, a thickness and a planar dimension (a plane area) of the electronic component contained substrate 100 can be reduced largely.

Second Embodiment

Figure 9:
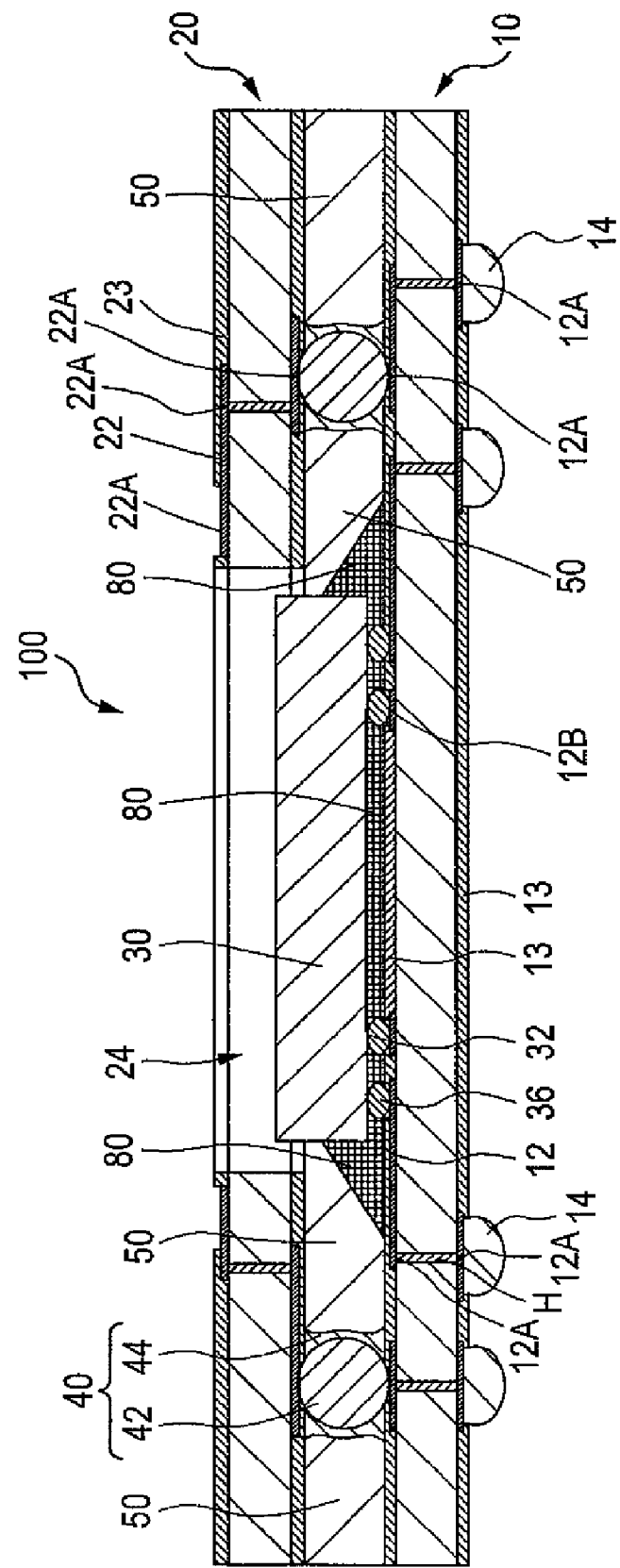
FIG. 9 is a cross sectional view showing a structure in a second embodiment of an electronic component contained substrate according to the present invention.

FIG. 9 is a cross sectional view showing a structure in a second embodiment of an electronic component contained substrate according to the present invention. The present embodiment shows the electronic component contained substrate 100, in which the liquid sealing resin 50 is injected and sealed between the wiring substrate 10 and the wiring substrate 20. In FIG. 9, such a situation is shown that the connection pads 12A provided on the upper surface side of the wiring substrate 10 and the connection pads 22A provided on the lower surface side of the wiring substrate 20 are connected electrically mutually via the solder balls 40, then the liquid sealing resin 50 is injected into a space between the wiring substrate 10 and the wiring-substrate 20, and then the sealing resin 50 is thermally cured.

When the liquid sealing resin 50 is injected from a side end surface portion between the wiring substrate 10 and the wiring substrate 20, such liquid sealing resin 50 penetrates into a space between the wiring substrate 10 and the wiring substrate 20 by means of a capillary phenomenon, and thus the sealing resin 50 is filled into a space between the wiring substrate 10 and the wiring substrate 20. The sealing resin 50 being injected into a space between the wiring substrate 10 and the wiring substrate 20 is set to a height position of the lower surface of the wiring substrate 20 in the opening portion 24, as shown in FIG. 9. As a result, the back surface side of the semiconductor element 30 is exposed from the sealing resin 50.

In the present embodiment, the electronic component contained substrate 100 is constructed such that the back surface side of the semiconductor element 30 is exposed from the sealing resin 50 in the opening portion 24. Therefore, the heat radiation characteristic of the electronic component contained substrate 100 can be improved by fitting a radiation plate, for example, to the back surface of the semiconductor element 30. As another example, another semiconductor element can be mounted further on the back surface of the semiconductor element 30.

Third Embodiment

Figure 10:
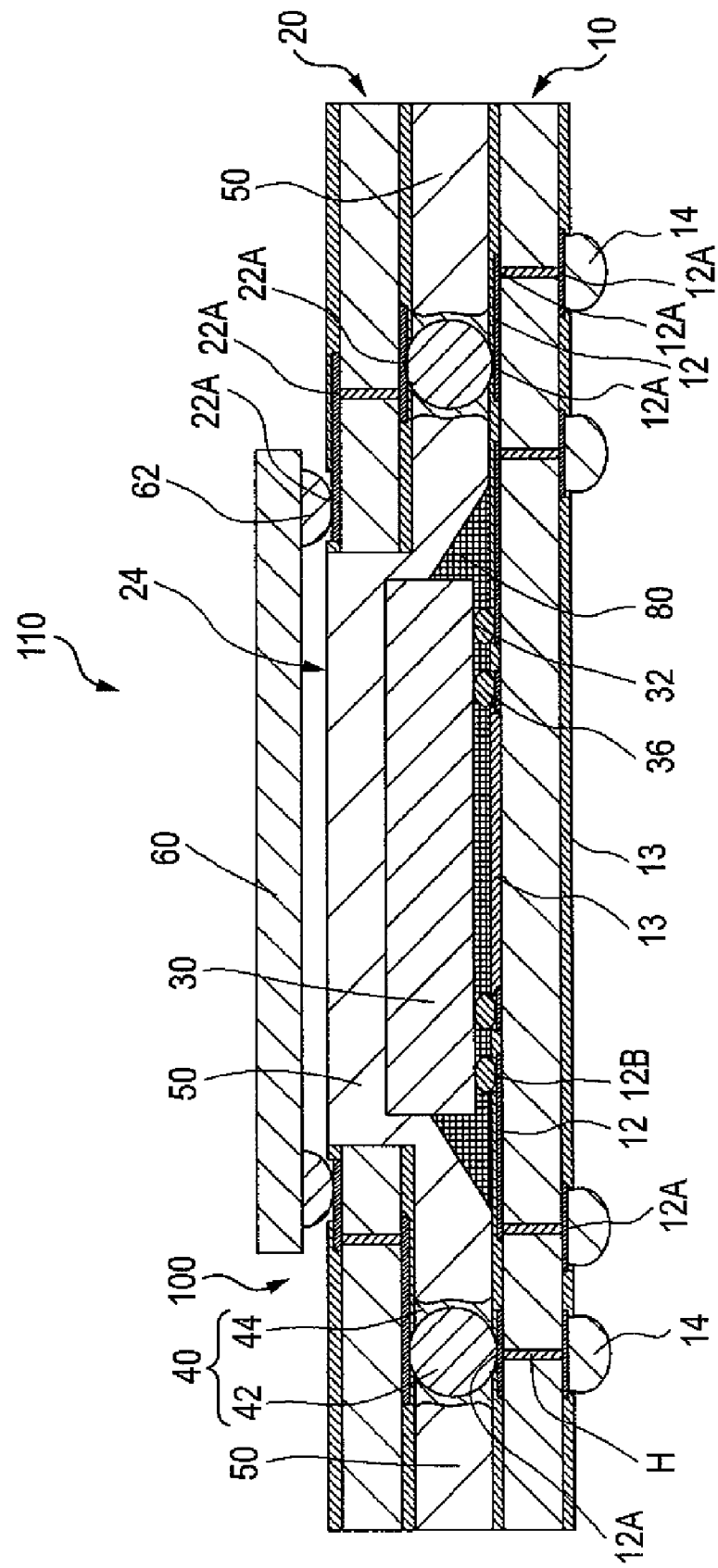
FIG. 10 is a cross sectional view showing a structure in a third embodiment of an electronic component contained substrate according to the present invention.
Figure 11:
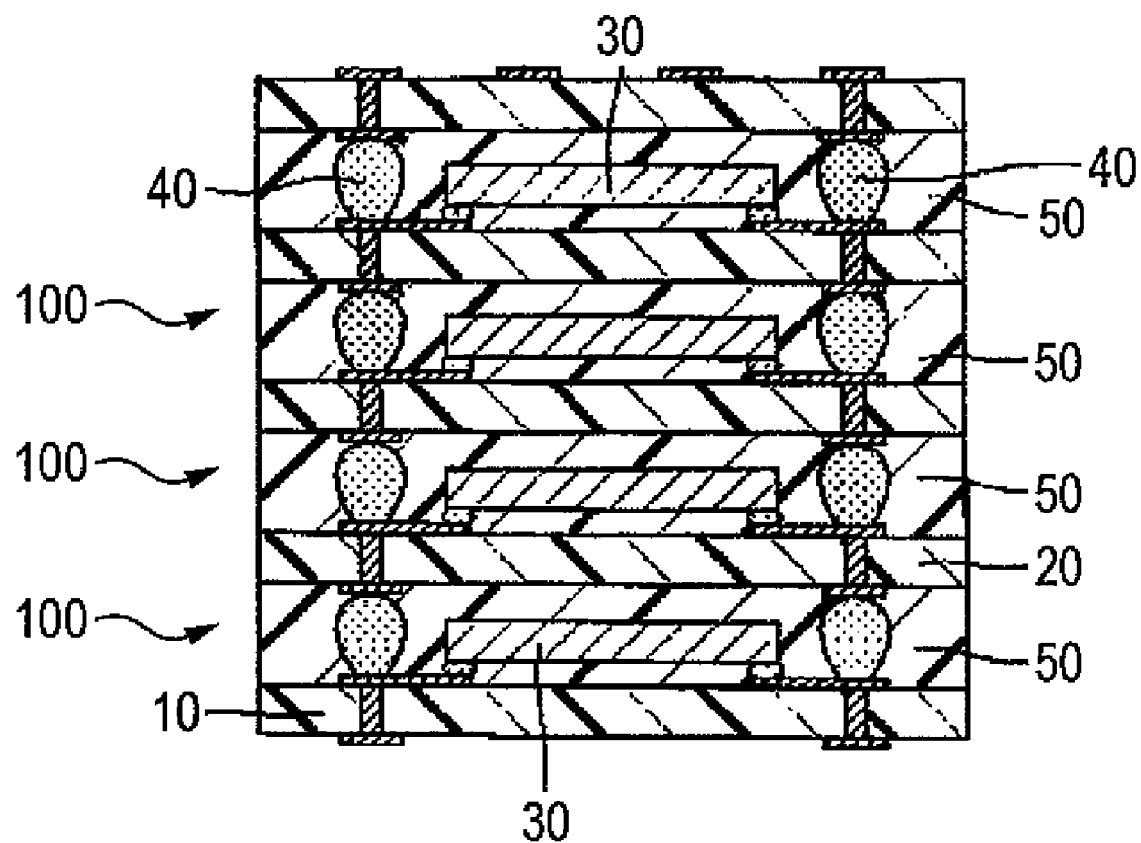
FIG. 11 is an explanatory view of an electronic component contained substrate in the related art.

Next, a third embodiment of the present invention will be explained hereunder. FIG. 10 is a cross sectional view showing a structure in a third embodiment of an electronic component contained substrate according to the present invention. The present embodiment shows an electronic component contained substrate (semiconductor device) 110 in which another electronic component (semiconductor element) 60 is mounted on the electronic component contained substrate (semiconductor device) 100 explained in the first embodiment. The electronic component 60 is mounted on the wiring substrate 20 to cover the opening portion 24 via external connection terminals 62.

A clearance between the wiring substrate 10 and the wiring substrate 20 is formed sufficiently shorter than that in the related art, and the electronic component (semiconductor element) 30 including the back surface is sealed with the sealing resin 50. Therefore, it is not needed that the mounting position of the electronic component (semiconductor element) 60 should be set to avoid the underfill area of the semiconductor element that is connected to the wiring substrate 10 by flip-chip bonding, and the electronic component 60 can be connected in a state that a standoff amount is reduced. As a result, the electronic component contained substrate 110 can be formed thinner in a compact way.

Also, in addition to the mounting of the electronic component 60 shown in FIG. 10, a circuit component such as a chip capacitor, a chip resistor, or the like can be mounted on the wiring substrate 20. Even when the circuit component, or the like is mounted on the wiring substrate 20, the circuit component, or the like can be mounted to cover the opening portion 24.

With the above, the electronic component contained substrate (semiconductor device) 100 according to the present invention will be explained in detail based on the embodiment. But the present invention of this application is not limited to the above embodiment. It is needless to say that various variations and modifications made in a range not to change a gist of the present invention should belong to the technical scope of the present invention of this application.

For example, in the above embodiment, explanation is made by taking the semiconductor element as an example of the electronic component 30. But the electronic component 30 is not limited to the semiconductor element, and other electronic component may be employed.

Also, in the above embodiment, the solder ball 40 using the copper core 42 as the core material is employed. But the solder ball 40 whose copper-core 42 is formed of any metal-or other substance except copper may be employed if such conductor has a softening temperature that is sufficiently higher than a melting point of the solder.

Further, the semiconductor element 30 may be mounted on the wiring substrate 10 not by the flip-chip bonding but by the wire bonding.

Also, in the above embodiment, such a mode is explained that the back surface (upper surface in FIG. 10) position of the semiconductor element 30 is held within the thickness of the wiring substrate 20. However, even when a mode where the back surface of the semiconductor element 30 is projected from the upper surface of the wiring substrate 20 when the semiconductor element 30 is mounted is employed, the electronic component contained substrate 100 can be thinned rather than the thickness of the electronic component contained substrate in the related art, and also the electronic component contained substrate can be miniaturized.

What is claimed is:

1. An electronic component contained substrate comprising:
    a first wiring substrate and a second wiring substrate adjacent and spaced apart from the first wiring substrate such that the first wiring substrate and the second wiring substrate define a space therebetween;
    an electronic component having a connection terminal on a lower surface which is mounted to a surface of the first wiring substrate facing the space between the first and second wiring substrates;
    a solder ball disposed in the space between the first and second wiring substrates which electrically connects the first and second wiring substrates; and
    a sealing resin which seals the space between the first and second wiring substrates such that the electronic component and the solder ball is substantially sealed by the sealing resin,
    wherein the second wiring substrate, which faces the first wiring substrate on which the electronic component is mounted, has an opening portion, which is larger than a planar shape of the electronic component, in a position that opposes the electronic component,
    wherein the solder ball has a predetermined size such that an upper portion of the electronic component extends into and is accommodated in the opening portion of the second wiring substrate, and
    wherein the electronic component is mounted to the surface of the first wiring substrate by flip-chip bonding.

2. An electronic component contained substrate according to claim 1, wherein the electronic component is mounted such that an upper surface of the electronic component is positioned within a thickness of the second wiring substrate.

3. An electronic component contained substrate according to claim 1, wherein an upper surface of the electronic component is exposed from the sealing resin.

4. An electronic component contained substrate according to claim 1, wherein the sealing resin is filled in the opening portion.

5. An electronic component contained substrate according to claim 1, wherein the solder ball is a core contained solder ball in which a solder is coated on an outer surface of a core material made of metal.

6. An electronic component contained substrate according to claim 1, further comprising:
another electronic component or a circuit component which is mounted on an outer surface of the second wiring substrate with the opening portion to cover at least a part of the opening portion.

7. An electronic component contained substrate according to claim 5, wherein the core material is formed of copper.

* * * * *